(12) United States Patent
Kang et al.

(10) Patent No.: US 11,133,443 B2
(45) Date of Patent: Sep. 28, 2021

(54) LIGHT EMITTING DEVICE PACKAGE AND METHOD OF MANUFACTURING LIGHT EMITTING DEVICE PACKAGE

(71) Applicant: SAMSUNG ELECTRONICS CO., LTD., Suwon-si (KR)

(72) Inventors: Chi-Goo Kang, Seoul (KR); Young-Kyung Kim, Hwaseong-si (KR); Young-Ho Park, Yongin-si (KR); Jong-Won Park, Suwon-si (KR); Seog-Ho Lim, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/507,183

(22) Filed: Jul. 10, 2019

(65) Prior Publication Data

US 2020/0243731 A1 Jul. 30, 2020

(30) Foreign Application Priority Data

Jan. 29, 2019 (KR) .......................... 10-2019-0011204

(51) Int. Cl.
| | |
|---|---|
| *H01L 33/50* | (2010.01) |
| *H01L 33/54* | (2010.01) |
| *H01L 33/48* | (2010.01) |
| *H01L 33/64* | (2010.01) |
| *H01L 33/62* | (2010.01) |

(52) U.S. Cl.
CPC .......... *H01L 33/507* (2013.01); *H01L 33/486* (2013.01); *H01L 33/502* (2013.01); *H01L 33/505* (2013.01); *H01L 33/54* (2013.01); *H01L 33/647* (2013.01); *H01L 33/62* (2013.01); *H01L 2933/005* (2013.01); *H01L 2933/0033* (2013.01); *H01L 2933/0041* (2013.01); *H01L 2933/0066* (2013.01)

(58) Field of Classification Search
None
See application file for complete search history.

(56) References Cited

U.S. PATENT DOCUMENTS

| | | |
|---|---|---|
| 8,502,364 B2 | 8/2013 | Kato et al. |
| 9,634,202 B2 | 4/2017 | Huang et al. |
| 10,003,039 B2 | 6/2018 | Jang et al. |

(Continued)

FOREIGN PATENT DOCUMENTS

JP 2018-88468 A 6/2018

*Primary Examiner* — Long Pham
(74) *Attorney, Agent, or Firm* — Sughrue Mion, PLLC

(57) ABSTRACT

A light emitting device package includes a mounting substrate including first and second lower electrode portions separated by a first groove, first and second upper electrode portions separated by a second groove connected to the first groove and disposed on the first and second lower electrode portions respectively, and an insulation support member filling the first groove, a light emitting device mounted on the first and second upper electrode portions of the mounting substrate, a double phosphor film covering an upper surface of the light emitting device, including a phosphor layer and a barrier layer sequentially stacked on each other, and having a thickness of 200 μm or less, and a sealing member on the mounting substrate covering the light emitting device and the double phosphor film.

15 Claims, 19 Drawing Sheets

(56) References Cited

U.S. PATENT DOCUMENTS

| | | | |
|---|---|---|---|
| 2007/0108888 A1* | 5/2007 | Chen | C09K 11/883 |
| | | | 313/503 |
| 2018/0226385 A1 | 8/2018 | Nakabayashi et al. | |
| 2018/0226549 A1 | 8/2018 | Nakabayashi et al. | |
| 2018/0366615 A1* | 12/2018 | Kang | H01L 23/495 |
| 2020/0243731 A1* | 7/2020 | Kang | H01L 33/647 |

* cited by examiner

LIGHT EMITTING DEVICE PACKAGE AND METHOD OF MANUFACTURING LIGHT EMITTING DEVICE PACKAGE

PRIORITY STATEMENT

This application claims priority under 35 U.S.C. § 119 from Korean Patent Application No. 10-2019-0011204, filed on Jan. 29, 2019 in the Korean Intellectual Property Office (KIPO), the contents of which are herein incorporated by reference in their entirety.

BACKGROUND

1. Field

Example embodiments relate to a light emitting device package and a method of manufacturing the same. More particularly, example embodiments relate to a light emitting device package including a light emitting device mounted on a metal substrate instead of a lead frame and a phosphor layer on the light emitting device, and a method of manufacturing the same.

2. Description of the Related Art

In manufacturing a light emitting device package, a phosphor layer having KSF phosphor may be used for wide color gamut performance. However, because the KSF phosphor is likely to degrade due to moisture, it may be difficult in securing reliability.

SUMMARY

It is an aspect to provide a light emitting device package having excellent wide color gamut performance and heat dissipating property.

It is an aspect to provide a method of manufacturing the light emitting device package.

According to an aspect of one or more example embodiments, a method of manufacturing a light emitting device package comprises providing a metal substrate having a first surface and a second surface opposite to each other; etching the first surface of the metal substrate to form a first lower electrode portion and a second lower electrode portion separated by a first groove; forming an insulation support member filling the first groove; etching the second surface of the metal substrate to form a first upper electrode portion and a second upper electrode portion on the first lower electrode portion and the second lower electrode portion respectively, the first upper electrode portion and the second upper electrode portion being separated by a second groove connected to the first groove; stacking a light emitting device on a double phosphor film having a barrier layer and a phosphor layer to form a stacked structure; arranging the stacked structure on the metal substrate such that the light emitting device is mounted on the first upper electrode portion and the second upper electrode portion; and forming a sealing member on the insulation support member and the first upper electrode portion and the second upper electrode portion to cover the light emitting device and the double phosphor film.

According to another aspect of one or more example embodiments, a method of manufacturing a light emitting device package comprises forming a mounting substrate including a first lower electrode portion and a second lower electrode portion separated by a first groove, a first upper electrode portion and a second upper electrode portion separated by a second groove connected to the first groove and disposed on the first lower electrode portion and the second lower electrode portion respectively, and an insulation support member filling the first groove; stacking a light emitting device on a double phosphor film having a barrier layer and a phosphor layer to form a stacked structure; arranging the stacked structure on the mounting substrate such that the light emitting device is mounted on the first upper electrode portion and the second upper electrode portion; and forming a sealing member on the insulation support member and the first upper electrode portion and the second upper electrode portion to cover the light emitting device and the double phosphor film.

According to another aspect of one or more example embodiments, a light emitting device package comprises a mounting substrate including a first lower electrode portion and a second lower electrode portion separated by a first groove, a first upper electrode portion and a second upper electrode portion separated by a second groove connected to the first groove and disposed on the first lower electrode portion and the second lower electrode portion respectively, and an insulation support member filling the first groove; a light emitting device mounted on the first upper electrode portion and the second upper electrode portion of the mounting substrate; a double phosphor film covering an upper surface of the light emitting device, including a phosphor layer and a barrier layer sequentially stacked on each other, and having a thickness of about 200 µm or less; and a sealing member on the mounting substrate that covers the light emitting device and a side surface of the double phosphor film.

According to another aspect of one or more example embodiments, a light emitting device package comprises a mounting substrate including a first electrode and a second electrode separated by a groove, and an insulation support member in the groove, a first height of the insulation support member from the mounting substrate being less than a second height of the first electrode and the second electrode; a light emitting device mounted on the first electrode and the second electrode; a double phosphor film comprising a phosphor layer and a barrier layer and having a thickness of about 200 µm or less, the double phosphor film covering an upper surface of the light emitting device; and a sealing member on the mounting substrate that covers the light emitting device and the double phosphor film

BRIEF DESCRIPTION OF THE DRAWINGS

Example embodiments will be more clearly understood from the following detailed description taken in conjunction with the accompanying drawings, in which.

DETAILED DESCRIPTION

According to example embodiments, a mounting substrate for mounting a light emitting device may be formed by using a metal substrate. The mounting substrate may include first and second electrode portions separated by a slit and an insulation support member filling a lower portion of the slit and covering a side surface of each of the first and second electrode portions.

An upper surface of the insulation support member may be formed to be lower than upper surfaces of the first and second electrode portions, to thereby prevent spreading of a solder bump during a flip chip bonding process. Each of the first and second electrode portions may be formed to have an area greater than a bonding area with the solder bump to thereby provide excellent heat dissipating property.

Further, a double phosphor film including a phosphor layer and a barrier layer may be adhered on a light emitting surface of the light emitting device. The phosphor layer may include phosphor having excellent wide color gamut performance. The barrier layer may cover the phosphor layer to prevent the phosphor from degrading due to moisture.

Thus, the light emitting device package may have the excellent wide color gamut performance and heat dissipating properties Hereinafter, example embodiments will be explained in detail with reference to the accompanying drawings.

Figure 1:
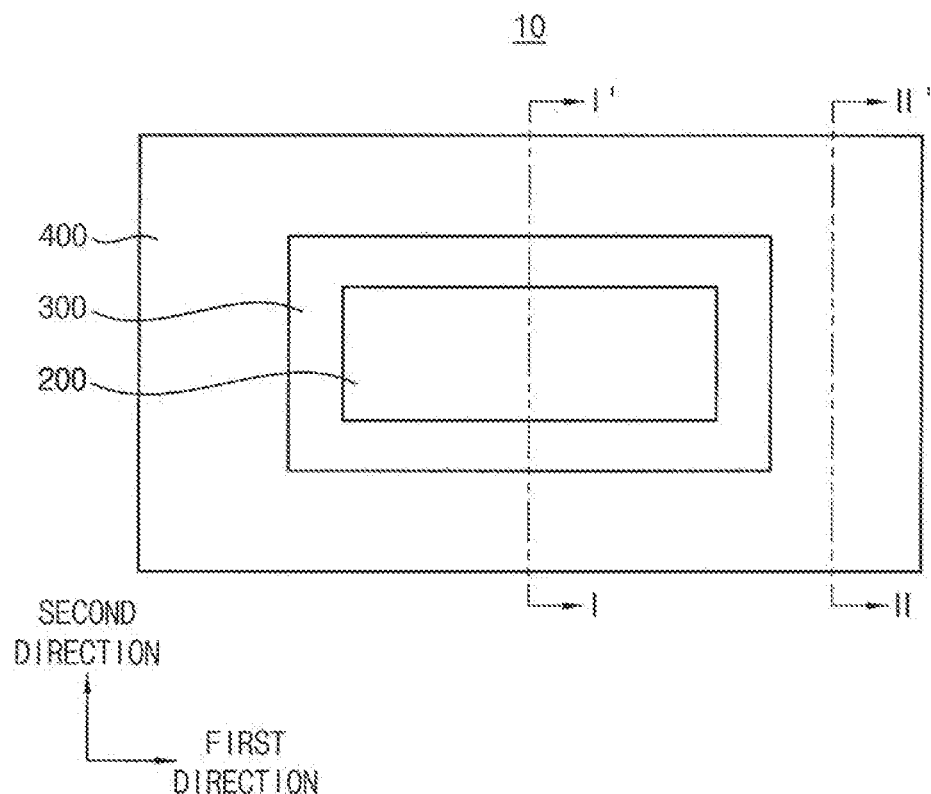
FIG. 1 is a plan view illustrating a light emitting device package in accordance with example embodiments.
Figure 2:
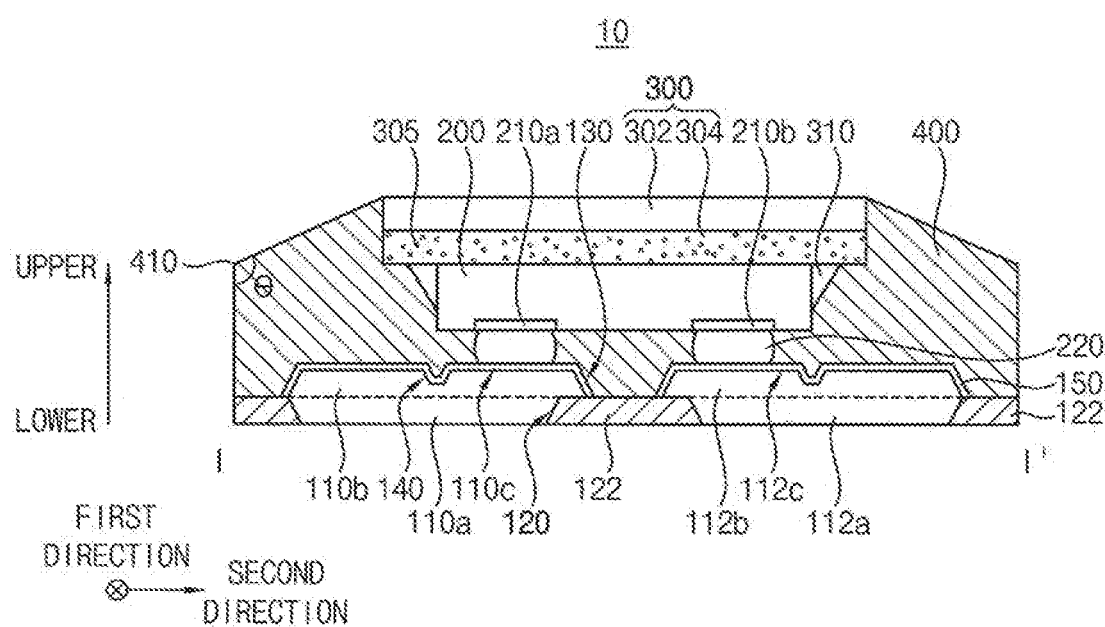
FIG. 2 is a cross-sectional view taken along the line I-I' in FIG. 1.
Figure 3:
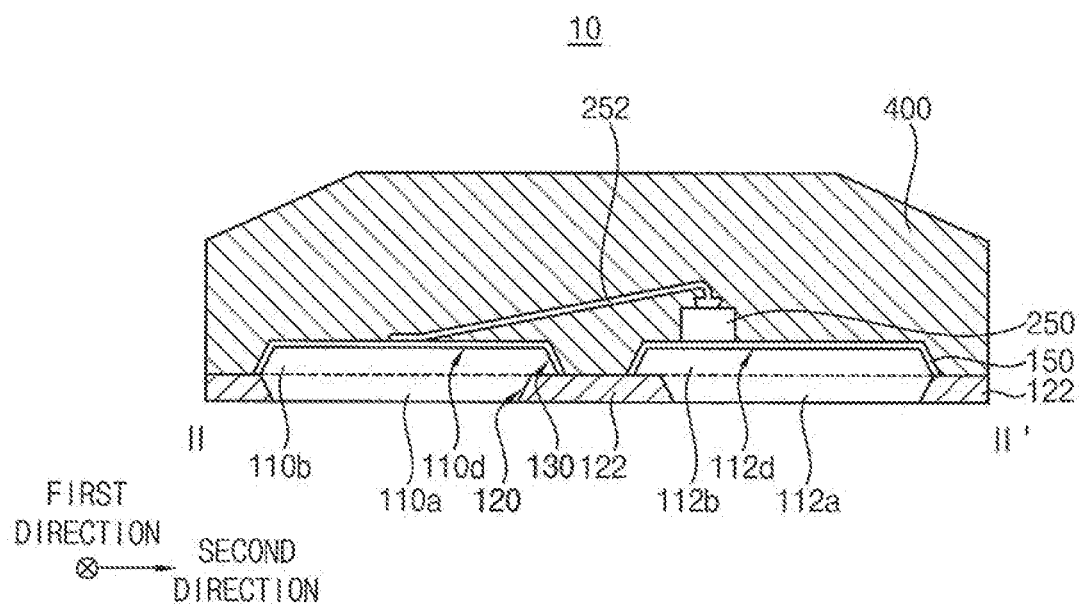
FIG. 3 is a cross-sectional view taken along the line II-II' in FIG. 1.
Figure 4:
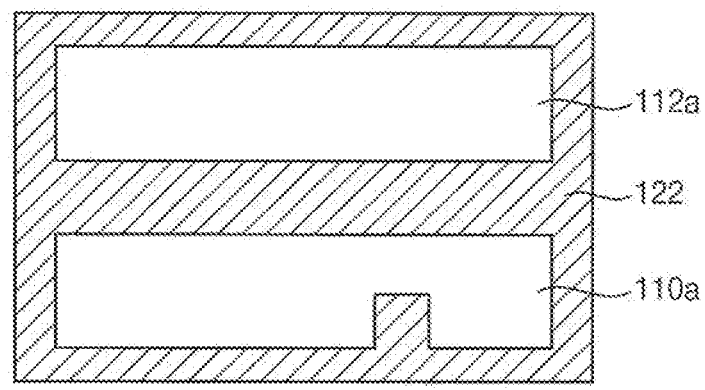
FIG. 4 is a bottom view illustrating the light emitting device package of FIG. 1.

FIG. 1 is a plan view illustrating a light emitting device package in accordance with example embodiments. FIG. 2 is a cross-sectional view taken along the line I-I' in FIG. 1. FIG. 3 is a cross-sectional view taken along the line II-II' in FIG. 1. FIG. 4 is a bottom view illustrating the light emitting device package in FIG. 1.

Referring to FIGS. 1 to 4, a light emitting device package 10 may include a mounting substrate having a first electrode portion and a second electrode portion separated and insulated from each other, a light emitting device 200 mounted on the first and second electrode portions of the mounting substrate, a double phosphor film 300 covering an upper surface of the light emitting device 200, and a sealing member 400 covering the light emitting device 200 and the double phosphor film 300 on the mounting substrate.

In example embodiments, the mounting substrate may be used as a package body for mounting the light emitting device 200. A first surface of the mounting substrate may provide a mounting region for mounting the light emitting device, a diode, etc., and a second surface of the mounting substrate opposite to the first surface may provide an external connection region for electrical connection with an external circuit or external circuit board.

The mounting substrate may include the first and second electrode portions separated by a recess, and an insulation support member 122 filing a lower portion of the recess and covering a lower side surface of each of the first and second electrode portions. The first electrode portion may include a first lower electrode portion 110a and a first upper electrode portion 110b on the first lower electrode portion 110a, and the second electrode portion may include a second lower electrode portion 112a and a second upper electrode portion 112b on the second lower electrode portion 112a.

The first and second electrode portions may include a metal having excellent electrical conductivity and heat dissipating properties. Examples of the metal may be copper (Cu), nickel (Ni), magnesium (Mg), gold (Au), silver (Ag), palladium (Pd) or a combination thereof. The insulation support member 122 may include an insulating material such as epoxy molding compound (EMC), silicon molding compound (SMC), silicon resin (SR), etc. that is configured to electrically isolate the first and second electrode portions from each other.

A first groove 120 may be formed between the first lower electrode portion 110a and the second lower electrode portion 112a, and a second groove 130 may be formed between the first upper electrode portion 110b and the second upper electrode portion 112b. The first groove 120 and the second groove 130 may be connected to each other to form the recess. A width of the first groove 120 may be the same as or different from a width of the second groove 130.

The insulation support member 122 may fill up the first groove 120, cover side surfaces of each of the first and second lower electrode portions 110a and 112a, and expose the first and second upper electrode portions 110b and 112b. Upper surfaces of the first and second electrode portions may be higher than an upper surface of the insulation support member 122 between the first and second electrode portions. (See also, e.g., FIG. 25). Upper surfaces of the first and second upper electrode portions 110b and 112b may be higher than the upper surface of the insulation support member 122 exposed through the second groove 130.

In example embodiments, the mounting substrate may have thermal resistance (Rth) lower than thermal resistance of a conventional lead frame. The thermal resistance (Rth) of the mounting substrate may range from about 5 K/W to about 7 K/W. The thermal resistance of the lead frame may be greater than about 15 K/W. As best seen in FIG. 4, when viewed in plan view, a combined area occupied by the first and second electrode portions may be 70% or more of the whole area. The area occupied by the first and second electrode portions may be at least nine times larger than an area of the insulation support member 122.

Thus, instead of the conventional lead frame of the related art, the mounting substrate including the first and second electrode portions separated from each other according to example embodiments may be used to improved heat transfer performance, to thereby improve heat dissipating properties of the light emitting device package.

In example embodiments, the light emitting device 200 may be mounted on the mounting substrate in a flip chip bonding method. A first electrode 210a and a second electrode 210b may be provided on a lower surface of the light emitting device 200. The light emitting device 200 may be mounted on the mounting substrate such that the lower surface of the light emitting device 200 faces the mounting substrate. The light emitting device 200 may be mounted on the mounting substrate via connection members 220 such as solder bumps. It will be understood that, in some embodiments, light may be emitted from the upper surface of the light emitting device 200 that is opposite the lower surface.

The first and second upper electrode portions 110b and 112b arranged side by side with each other in a second direction may have respectively a first bonding region 110c and a second bonding region 112c bonded to the electrodes 210a and 210b of the light emitting device respectively. The first electrode 210a may be bonded to the first bonding region 110c of the first upper electrode portion 110b by the connection member 220, and the second electrode 210b may be bonded to the second bonding region 112c of the second upper electrode portion 112b by the connection member 220.

A longitudinal direction of the light emitting device 200 may be parallel with a first direction. A plurality of the first electrodes 210a may be arranged in the first direction on the lower surface of the light emitting device 200 corresponding to a plurality of the first bonding regions 110c to be spaced apart from each other in the first direction. A plurality of the second electrodes 210b may be arranged in the first direction on the lower surface of the light emitting device 200 corresponding to a plurality of the second bonding regions 112c to be spaced apart from each other in the first direction.

First recesses 140 may be formed in the upper surfaces of the first and second upper electrode portions 110b and 112b respectively. The first recess 140 of the first upper electrode portion 110b may be formed adjacent to the first bonding region 110c. The first recess of the second upper electrode portion 112b may be formed adjacent to the second bonding region 112c.

The insulation support member 122 may be formed lower than the upper surfaces of the first and second electrode portions to thereby prevent spreading of the solder bump during the flip chip bonding process. Additionally, the first recesses 140 may be formed around the first and second bonding regions 110c and 112c to thereby prevent spreading of the solder bump during the flip chip bonding process. (See also, e.g., FIG. 25).

In example embodiments, as illustrated in FIG. 3, the light emitting device package 10 may further include a diode 250. The diode 250 may be arranged adjacent to the light emitting device 200 on the mounting substrate.

For example, the diode 250 may include a zener diode. A reverse current generated when a reverse voltage is applied may be blocked from flowing to the light emitting device 200, to thereby prevent damage to the light emitting device.

In example embodiments, the diode 250 may be mounted on the second upper electrode portion 112b. The diode 250 may include an upper electrode electrically connected to the first upper electrode portion 110b and a lower electrode electrically connected to the second upper electrode portion 112b.

The first and second upper electrode portions 110b and 112b facing each other may have respectively a third bonding region 110d and a fourth bonding region 112d bonded to connection members for electrical connection with the diode. The upper electrode of the diode 250 may be bonded to the third bonding region 110d of the first upper electrode portion 110b by a bonding wire 252, and the lower electrode of the diode 250 may be bonded to the fourth bonding region 112d of the second upper electrode portion 112b by a conductive connection member. The conductive connection member may include a conductive film.

In example embodiments, the double phosphor film 300 may be adhered on the upper surface of the light emitting device 200 as shown in FIG. 2. The double phosphor film 300 may include a phosphor layer 304 on the upper surface of the light emitting device 200 and a barrier layer 302 on the phosphor layer 304. Additionally, a filler 310 may be provided between a lower surface of the double phosphor film 300 and at least a portion of an outer side surface of the light emitting device 200, as shown in FIG. 2.

The barrier layer 302 may include a transparent material such as silicon-based resin, epoxy-based resin, etc. The phosphor layer 304 may include a transparent material such as silicon-based resin, epoxy-based resin, etc. The phosphor layer 304 may include phosphor particle 305. The phosphor of the phosphor layer 304 may have uniform concentration distribution or concentration gradient in a thickness direction.

For example, the phosphor of the phosphor particle 305 may include a manganese-activated potassium fluorosilicate phosphor ($K_2SiF_6:Mn^{4+}$(KSF)). The KSF phosphor may have a light emission wavelength of 630 nm to 632 nm. Since the KSF phosphor has a relatively narrow light emission of a spectral bandwidth in the red range, the KSF phosphor may have excellent wide color gamut performance. The KSF phosphor may have the property that the KSF phosphor is likely to degrade due to moisture. The barrier layer 302 may cover the phosphor layer 304 to prevent the phosphor layer 304 from degrading due to moisture.

The phosphor layer 304 may have External Quantum Efficiency of at least 70%. The phosphor particle 305 may have a particle size of about 13 μm to about 22 μm. In some example embodiments, a surface concentration of manganese of the phosphor layer 304 may be zero.

The double phosphor film 300 may have a thickness of about 200 μm or less in consideration of heat dissipation performance and prevention of moisture permeation. A thickness of the double phosphor film 300 may range from about 50 μm to about 200 μm. In some example embodiments, a thickness of the phosphor layer 304 may be greater than a thickness of the barrier layer 302. For example, the thickness of the phosphor layer 304 may range from about 100 μm to about 150 μm, and the thickness of the barrier layer 302 may range from about 50 μm to about 100 μm.

The sealing member 400 may be formed on the mounting substrate to cover the light emitting device 200 and the double phosphor film 300. The sealing member 400 may be formed to expose an upper surface of the double phosphor film 300. The sealing member 400 may cover the first surface of the mounting substrate, side surfaces of the double phosphor film 300 and side surfaces of the light emitting device 200. For example, the sealing member 400 may include titanium dioxide ($TiO_2$). The sealing member 400 may include a transparent material. Additionally, the sealing member 400 may further include a fluorescent material.

In example embodiments, an upper side edge 410 of the sealing member 400 may have an obtuse angle (θ) with respect to a side surface of the sealing member 400, as shown in FIG. 2. For example, the obtuse angle (θ) of the upper side edge 410 of the sealing member 400 may range from about 95 degrees to about 150 degrees.

As mentioned above, the light emitting device package may include the light emitting device 200 mounted on the mounting substrate having excellent heat dissipating properties, and the double phosphor film 300 having the phosphor layer 304 and the barrier layer 302 on the upper surface of the light emitting device 200. The phosphor layer 304 may include the phosphor having excellent wide color gamut performance. The barrier layer 302 may cover the phosphor layer 304 to prevent the phosphor of the phosphor layer 304 from degrading due to moisture.

Thus, the light emitting device package may have the excellent wide color gamut performance and heat dissipating properties.

Hereinafter, a method of manufacturing the light emitting device package in FIG. 1 will be explained.

Figure 28:
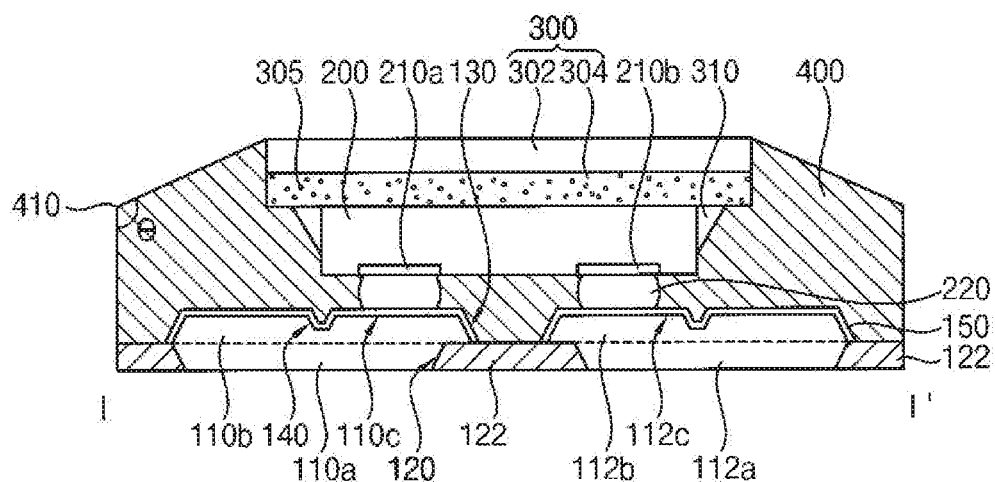
Figure 29:
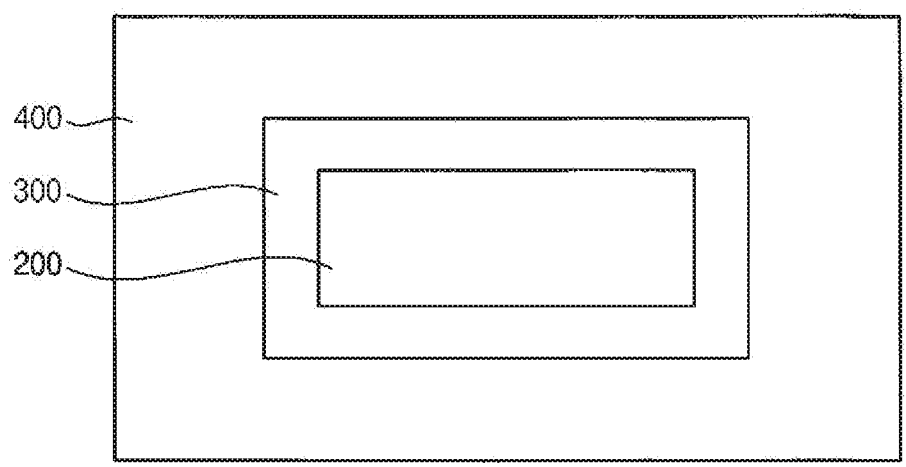
FIG. 29 is a plan view of the light emitting device package of FIG. 28.
Figure 30:
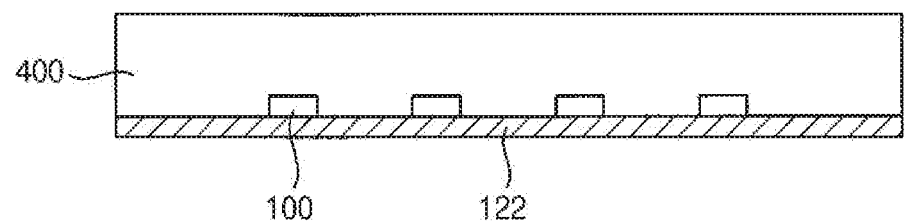
FIG. 30 is a side view of the light emitting device package of FIG. 28.
Figure 31:
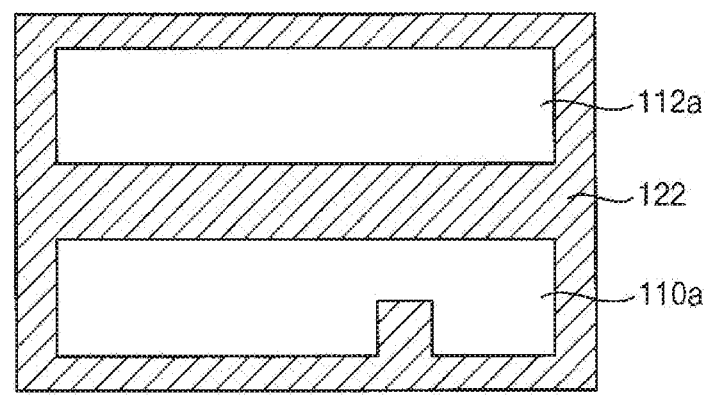
FIG. 31 is a bottom view of the light emitting device package of FIG. 28.

FIGS. 5, 7, 11 and 19 are plan views illustrating stages of manufacturing a light emitting device package in accordance with example embodiments. FIGS. 6, 8, 9, 10, 12, 13, 14, 15, 16, 17, 18, 20, 21, 22, 23, 24, 25, 26, 27 and 28 are cross-sectional views illustrating stages of manufacturing the light emitting device package in accordance with example embodiments. FIGS. 6, 8, 9, 10, 12, 13, 14, 16, 18, 20, 25, 27 and 28 are cross-sectional views taken along the line I-I' in the corresponding plan views of FIGS. 5, 7, 11, and 19. FIGS. 15, 17, 21 and 26 are cross-sectional views taken along the line II-II' in the corresponding plan views of FIGS. 5, 7, 11, and 19. FIG. 29 is a plan view of FIG. 28. FIG. 30 is a side view of FIG. 28. FIG. 31 is a bottom view of FIG. 28.

Figure 5:
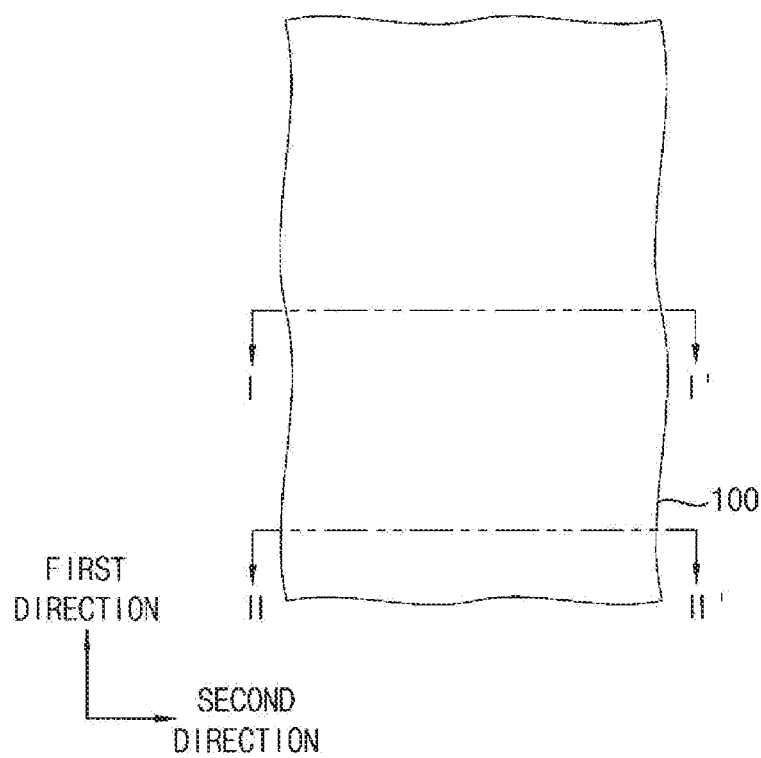
FIGS. 5, 7, 11 and 19 are plan views illustrating stages of manufacturing a light emitting device package in accordance with example embodiments.
Figure 6:
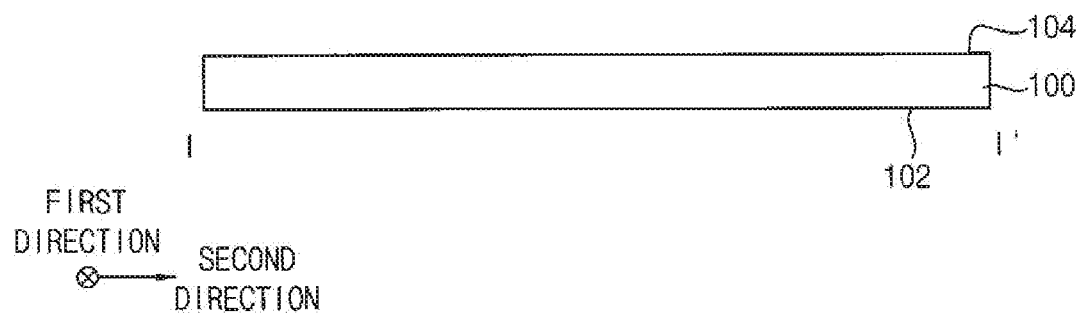
FIGS. 6, 8, 9, 10, 12, 13, 14, 15, 16, 17, 18, 20, 21, 22, 23, 24, 25, 26, 27 and 28 are cross-sectional views illustrating stages of manufacturing the light emitting device package in accordance with example embodiments.

Referring to FIGS. 5 and 6, first, a metal substrate 100 may be prepared.

In example embodiments, the metal substrate 100 may be used as a package body for mounting a light emitting device. The metal substrate 100 may have a first surface 102 and a second surface 104 opposite to each other. For example, the first surface 102 may provide a mounting region for mounting the light emitting device, a diode, etc., and the second surface 104 may provide an external connection region for electrical connection with an external circuit, tape board or other apparatus suitable for mounting light emitting diodes.

The metal substrate 100 may include a metal having excellent electrical conductivity and heat dissipating properties. Examples of the metal may be copper (Cu), nickel (Ni), magnesium (Mg), gold (Au), silver (Ag), palladium (Pd) or a combination thereof.

Figure 7:
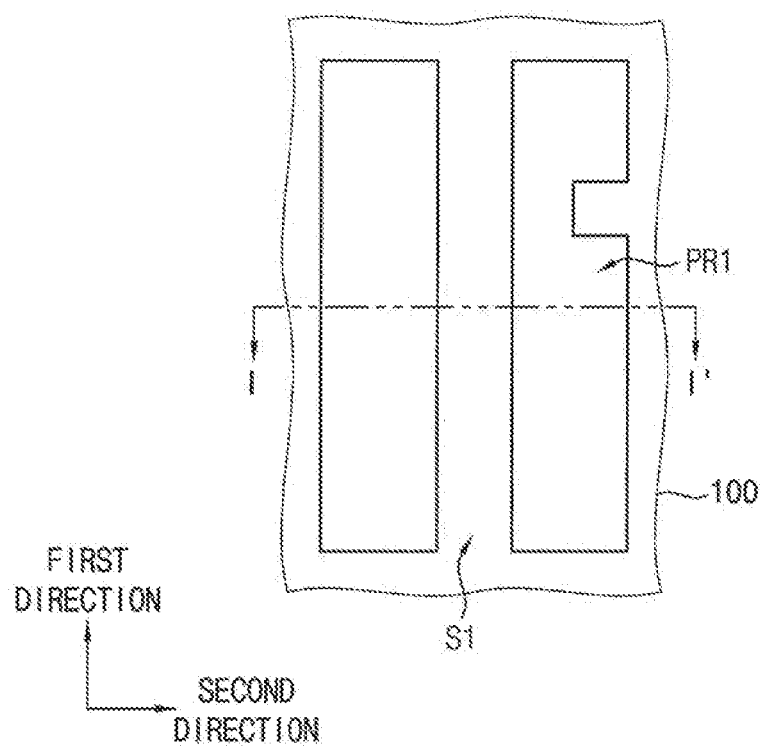
Figure 8:
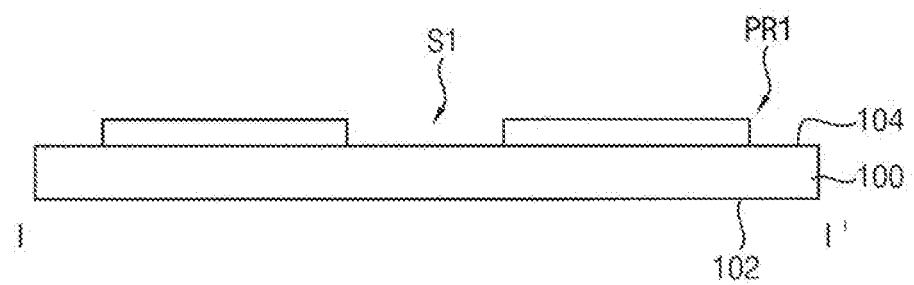

Referring to FIGS. 7 and 8, a first photoresist pattern PR1 may be formed on the second surface 104 of the metal substrate 100.

The first photoresist pattern PR1 may have a first line pattern and a second line patterns spaced apart from each other. Each of the first and second line patterns may have an isolated shape of the entire region of the metal substrate 100 used as the package body. A first opening S1 may be formed between the first and second line patterns. The first opening S1 may extend in a first direction.

Alternatively, the first opening S1 may include a first extending portion and a second extending portion connected to each other and extending in different directions. For example, the first extending portion may extend in the first direction, and the second extending portion may extend from an end portion of the first extending portion in a third direction different from the first direction.

Figure 9:
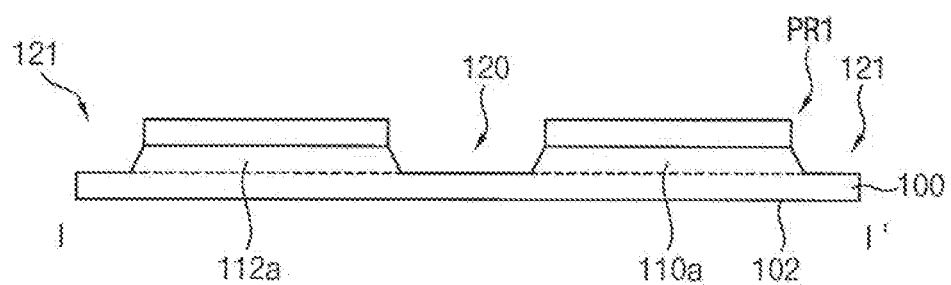
Figure 10:
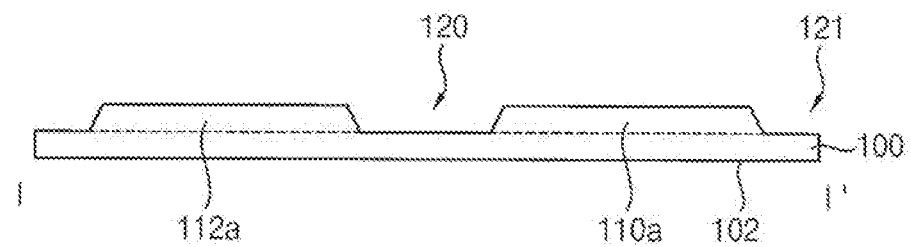

Referring to FIGS. 9 and 10, a portion of the metal substrate 100 exposed by the first photoresist pattern PR1 may be etched to form a first groove 120 having a depth from the second surface 104 of the metal substrate 100. The depth may be predetermined. Then, the first photoresist pattern PR1 may be removed from the metal substrate 100.

In example embodiments, the portion of the metal substrate 100 may be etched using the first photoresist pattern PR1 as an etching mask to form the first groove 120 having the depth from the second surface 104 of the metal substrate 100 and first edge grooves 121. A first lower electrode portion 110a and a second lower electrode portion 112a may be defined by the first groove 120 and the first edge grooves 121. The portion of the metal substrate 100 may be removed by an isotropic etch process.

For example, in some example embodiments, the first groove 120 and the first edge grooves 121 may be formed by the etch process to have a depth substantially the same as half of a thickness of the metal substrate 100 from the second surface 104 of the metal substrate 100. In this case, the first and second lower electrode portions 110a and 112a may have a thickness substantially the same as half of the substrate thickness from the second surface 104 of the metal substrate 100.

The first groove 120 may extend in the first direction. Alternatively, when the first opening S1 includes the first and second extending portions extending in different directions, the first groove may include a first extending groove portion extending in the first direction and a second extending groove portion extending from an end portion of the first extending groove portion in the third direction different from the first direction.

Figure 11:
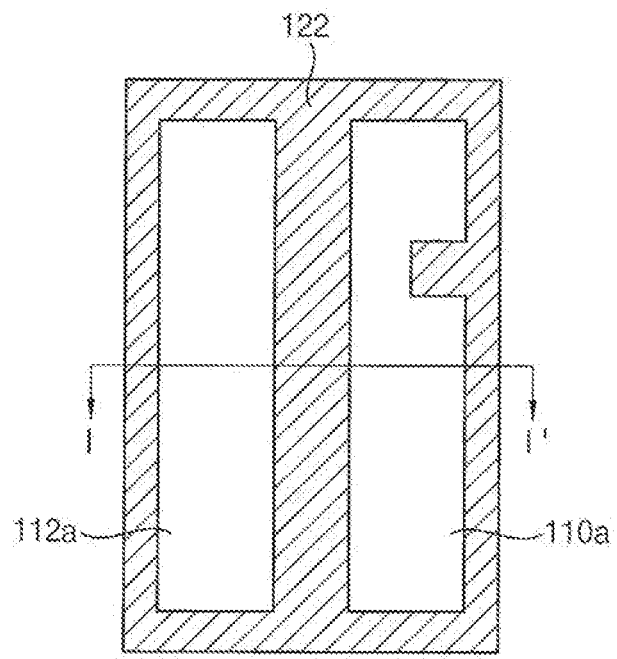
Figure 12:
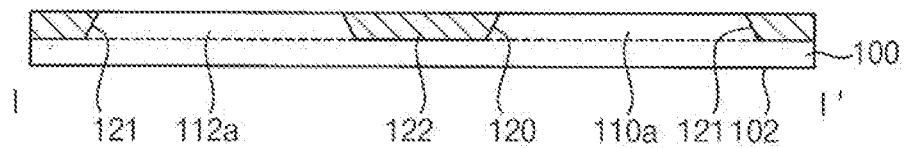

Referring to FIGS. 11 and 12, an insulation support member 122 may be formed to fill the first groove 120 and the first edge grooves 121.

In example embodiments, after an insulation material is coated on the second surface 104 of the metal substrate 100, a portion of the coated insulation material may be removed until surfaces of the first and second lower electrode portions 110a and 112a are exposed, to form the insulation support member 122.

The insulation support member 122 may be formed to surround both side surfaces of the first lower electrode portion 110a. The insulation support member 122 may be formed to surround both side surfaces of the second lower electrode portion 112a.

The insulation support member 122 may include an electrically insulating material such as epoxy molding compound (EMC), silicon molding compound (SMC), silicon resin (SR), etc. A surface of the insulation support member 122 may be coplanar with the surfaces of the first and second lower electrode portions 110a and 112a. As mentioned later, the first and second lower electrode portions 110a and 112 may be electrically connected to an external circuit or external circuit board.

Figure 13:
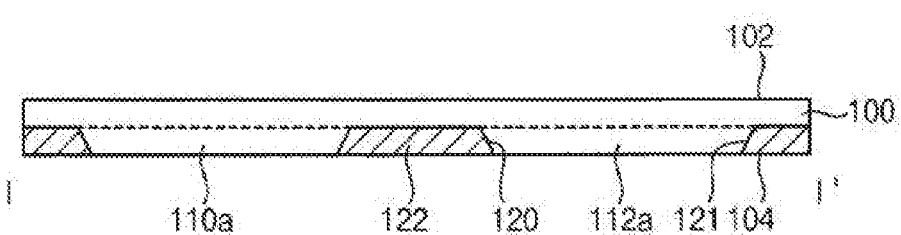
Figure 14:
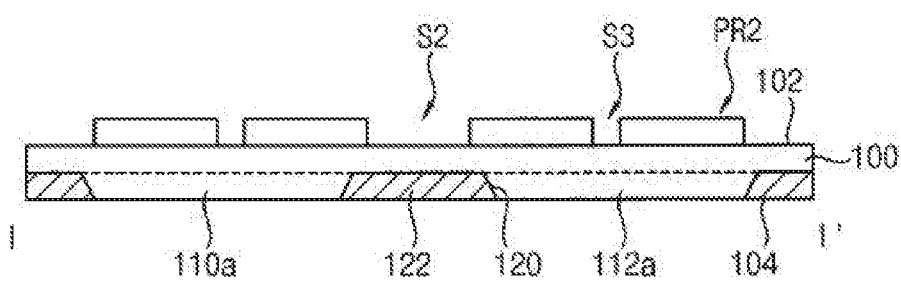
Figure 15:
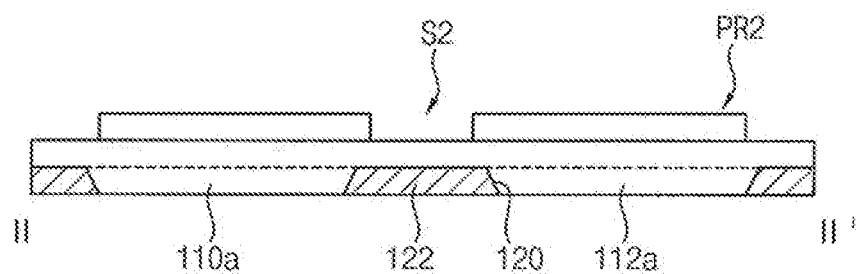

Referring to FIGS. 13, 14 and 15, in order to process the first surface 102 of the metal substrate 100, the metal substrate 100 may be turned over, and then, a second photoresist pattern PR2 may be formed on the first surface 102 of the metal substrate 100.

Similarly to the first photoresist pattern PR1, the second photoresist pattern PR2 may have a third line pattern and a fourth line pattern spaced apart from each other. A second opening S2 may be formed between the third and fourth line patterns. The second opening S2 may extend in the first direction. The second opening S2 may include a third extending portion extending in the first direction and a fourth extending portion extending from an end portion of the third extending portion in a third direction different from the first direction.

Each of the third and fourth line patterns may have a third opening S3 exposing a portion of the metal substrate adjacent to a region where a connection member for electrical connection with the light emitting device is arranged, respectively. In some example embodiments, the second opening S2 may have a first width, and the third opening S3 may have a second width less than the first width.

Figure 16:
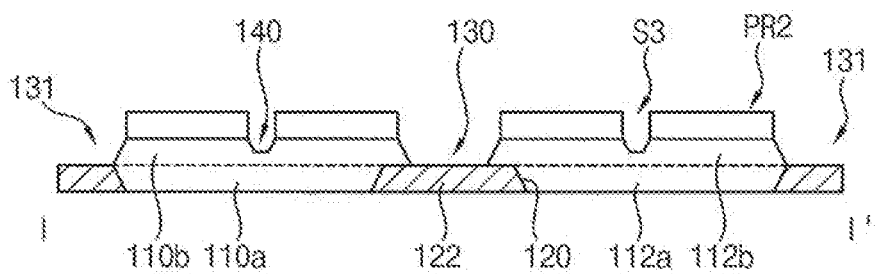
Figure 17:
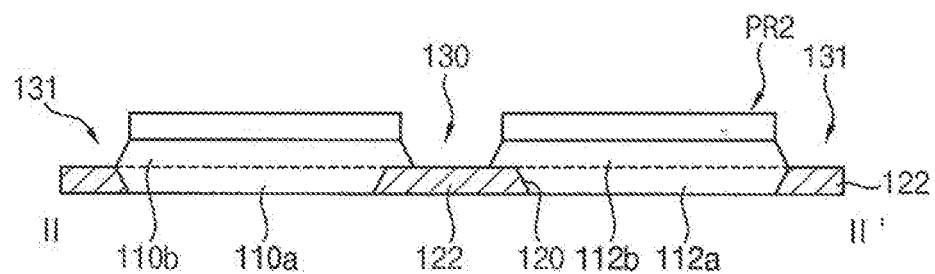
Figure 18:
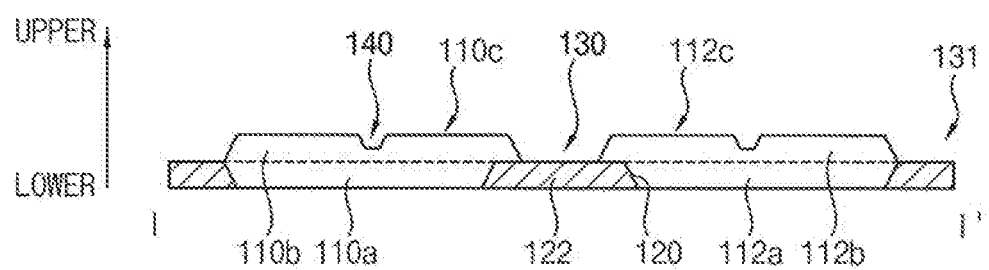

Referring to FIGS. 16, 17, and 18, a portion of the metal substrate 100 exposed by the second photoresist pattern PR2 may be etched to form a second groove 130 having a depth from the first surface 102 of the metal substrate 100. The depth may be predetermined. Then, the second photoresist pattern PR2 may be removed from the metal substrate 100.

In example embodiments, the portion of the metal substrate 100 may be etched using the second photoresist pattern PR2 as an etching mask to form the second groove 130 having the depth from the first surface 102 of the metal substrate 100, second edge grooves 131 and a first recess 140. A first upper electrode portion 110b and a second upper electrode portion 112b may be defined by the second groove 130 and the second edge grooves 131. The portion of the metal substrate 100 may be removed by an isotropic etch process.

For example, in some example embodiments, the second groove 130 and the second edge grooves 131 may be formed by the etch process to have a depth substantially the same as half of the substrate thickness from the first surface 102 of the metal substrate 100. In this case, the first and second upper electrode portions 110b and 112b may have a thickness substantially the same as half of the substrate thickness from the first surface 102 of the metal substrate 100.

In example embodiments, the second groove 130 may be connected to the first groove 120 to form a recess penetrating through the metal substrate 100. The second edge groove 131 may be connected to the first edge groove 121. The second groove 130 may be formed to expose a portion of the insulation support member 122, as shown in FIG. 16. The second edge groove 131 may be formed to expose a portion of the insulation support member 122.

Thus, the metal substrate 100 may be divided into two electrode portions by the insulation support member 122, that is, the first electrode portion and the second electrode portion. The first electrode portion may include the first lower electrode portion 110a and the first upper electrode portion 110b. The second electrode portion may include the second lower electrode portion 112a and the second upper electrode portion 112b. The first and second electrode portions may be spaced apart by the recess that is defined by the second groove 130 and the first groove 120. The first and second electrode portions may be electrically insulated from each other by the insulation support member 122.

Figure 19:
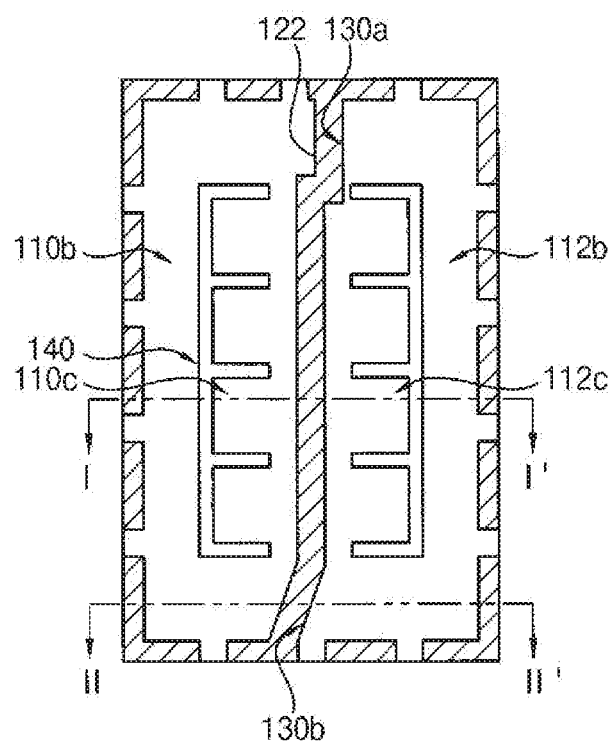
Figure 20:
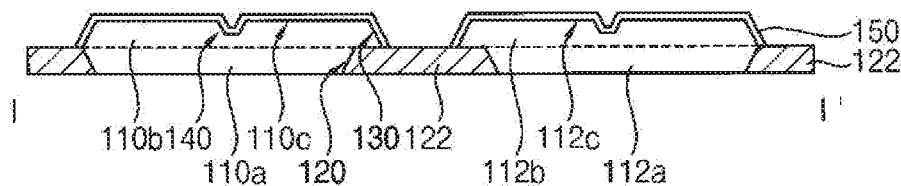
Figure 21:
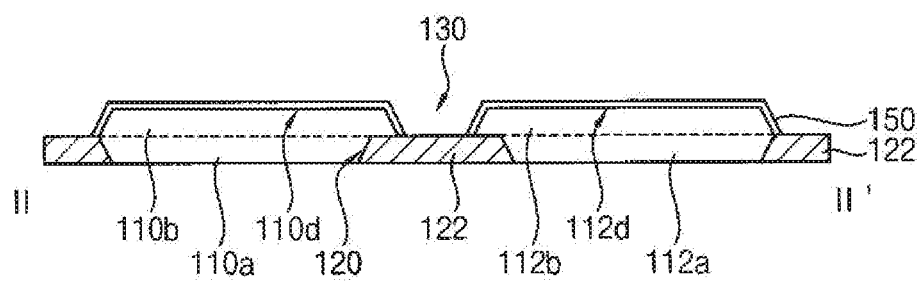

The second groove 130 may include a third extending groove portion 130a and a fourth extending groove portion 130b (see FIG. 19). The third extending groove portion 130a may extend in the first direction, and the fourth extending groove portion 130b may extend from an end portion of the third extending groove portion 130a in the third direction different from the first direction.

When the first groove 120 and/or the second groove 130 include extending groove portions extending in different directions, the recess may also include extending recess portions extending in the different directions.

The first recess 140 may have a depth from the first surface 102 of the substrate 100 less than a depth of the second groove 130. The first recesses 140 may be formed in the surfaces of the first and second upper electrode portions 110b and 112b respectively. The first recesses 140 may be formed in a region where the light emitting device is mounted.

Referring to FIGS. 18 to 21, the second photoresist pattern PR2 may be removed from the metal substrate 100, and an electroplating layer 150 may be formed on the surfaces of the first and second upper electrode portions 110b and 112b to form a mounting substrate for mounting the light emitting device and the diode.

In example embodiments, the electroplating layer 150 may be formed on the surfaces of the first and second upper electrode portions 110b and 112b by an electroplating process. In order to improve an adhesive strength with a following sealing member, the electroplating layer 150 may be surface-treated to have a surface roughness. The surface roughness may be predetermined.

Thus, the mounting substrate may include the first and second electrode portions separated by the first and second grooves 120 and 130 connected to each other, that is, the recess, and the insulation support member 122 surrounding at least a lower side surface of each of the first and second electrode portions to support the first and second electrode portions.

The first electrode portion may include the first lower electrode portion 110a and the first upper electrode portion 110b. The second electrode portion may include the second lower electrode portion 112a and the second upper electrode portion 112b. The insulation support member 122 may surround a side surface of the first lower electrode portion 110a and a side surface of the second lower electrode portion 112a. The first upper electrode portion 110b and the second upper electrode portion 112b may be exposed by the insulation support member 122. The insulation support member 122 may be exposed through the second groove 130 between the first and second upper electrode portions 110b and 112b. Upper surfaces of the first and second electrode portions may be positioned higher than an upper surface of the insulation support member 122 between the first and second electrode portions, as shown for example in FIG. 18.

The first and second upper electrode portions 110b and 112b facing each other may have first and second bonding regions 110c and 112c configured to bond to electrodes of the light emitting device respectively. The first recesses 140 may be formed in the surfaces of the first and second upper electrode portions 110b and 112b, respectively. The first recess 140 of the first upper electrode portion 110b may be formed adjacent to the first bonding region 110c. The first recess 140 of the second upper electrode portion 112b may be formed adjacent to the first bonding region 110c.

The first and second upper electrode portions 110b and 112b facing each other may have respectively the third and fourth bonding regions 110d and 112d (see FIG. 21) configured to bond to connection members for electrical connection with the diode.

In example embodiments, the mounting substrate may have a thermal resistance (Rth) lower than a thermal resistance of a conventional lead frame. The thermal resistance (Rth) of the mounting substrate may range from about 5 K/W to about 7 K/W.

In some example embodiments, when viewed in plan view, a combined area occupied by the first and second electrode portions may be 70% or more of the whole area. The area occupied by the first and second electrode portions may be at least nine times larger than an area of the insulation support member 122.

Thus, by contrast to a conventional lead frame of the related art, the mounting substrate including the first and second electrode portions separated from each other according to example embodiments may be used to improved heat transfer performance, to thereby improve heat dissipating properties of the light emitting device package.

Figure 22:
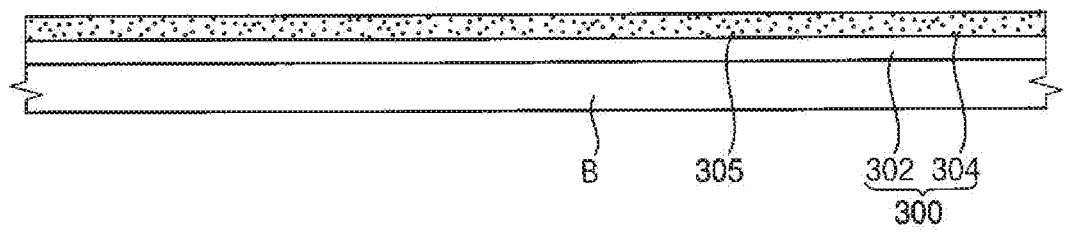
Figure 23:
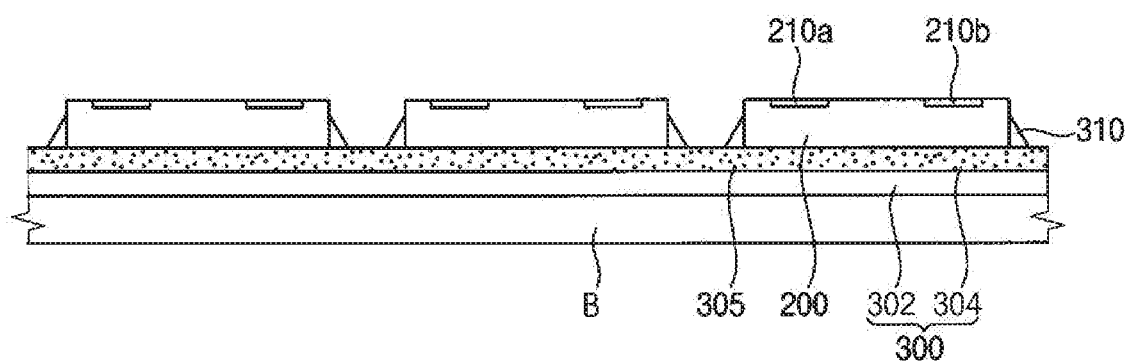
Figure 24:
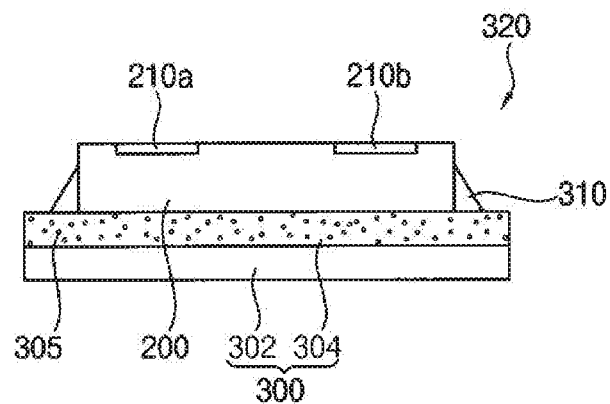

Referring to FIGS. 22 to 24, a stacked structure 320 including a light emitting device 200 and a double phosphor film 300 stacked on each other may be formed.

In example embodiments, the double phosphor film 300 may be formed on a base film B, a plurality of the light emitting devices 200 may be arranged on the double phosphor film 300, and then, the double phosphor film 300 may be separated into individual stacked structures 320. For example, in some example embodiments, the double phosphor film 300 may be sawed into the individual staged structures 320.

First, as illustrated in FIG. 22, a barrier layer 302 and a phosphor layer 304 may be formed sequentially on the base film B. The barrier layer 302 and the phosphor layer 304 in a semi-cured state may be adhered on the base film B.

The barrier layer 302 may include a transparent material such as silicon-based resin, epoxy-based resin, etc. The phosphor layer 304 may include a transparent material such as silicon-based resin, epoxy-based resin, etc. The phosphor layer 304 may include phosphor particles 305.

For example, the phosphor may include a manganese-activated potassium fluorosilicate phosphor ($K_2SiF_6:Mn^{4+}$ (KSF)). The KSF phosphor may have a light emission wavelength of 630 nm to 632 nm. Since the KSF phosphor has a relatively narrow light emission of a spectral bandwidth in the red range, the KSF phosphor may have excellent wide color gamut performance. The KSF phosphor may have the property that is likely to degrade due to moisture. The barrier layer 302 may cover the phosphor layer 304 to prevent the phosphor layer 304 from degrading due to moisture.

The phosphor layer 304 may have External Quantum Efficiency of at least 70%. The phosphor particles 305 may have a particle size of about 13 µm to about 22 µm. In some example embodiments, a surface concentration of manganese of the phosphor layer 304 may be zero.

The double phosphor film 300 may have a thickness of about 200 µm or less in consideration of heat dissipation performance and prevention of moisture permeation. A thickness of the double phosphor film 300 may range from about 50 µm to about 200 µm. A thickness of the phosphor layer 304 may be greater than a thickness of the barrier layer 302. The thickness of the phosphor layer 304 may range from about 100 µm to about 150 µm. The thickness of the barrier layer 302 may range from about 50 µm to about 100 µm.

The phosphor of the phosphor layer 304 may have uniform concentration distribution or concentration gradient in a thickness direction.

Then, as illustrated in FIGS. 23 and 24, a plurality of the light emitting devices 200 may be arranged on the double phosphor film 300, and then, the double phosphor film 300 may be cut to form the individual stacked structures 320.

The light emitting device 200 may be a photoelectric device which generates a light with a wavelength by an external power supply. The wavelength may be predetermined. For example, the light emitting device 200 may include a semiconductor light emitting diode (LED) chip having an n-type semiconductor layer, a p-type semiconductor layer and an active layer therebetween.

First and second electrodes 210*a* and 210*b* may be provided on a lower surface of the light emitting device 200. The light emitting device 200 may be arranged on the phosphor layer 304 such that an upper surface of the light emitting device 200 faces the phosphor layer 304. The light emitting devices 200 may be adhered on the phosphor layer 304 by an adhesive film (not illustrated).

A filler 310 may be formed on the phosphor layer 304 on side surfaces of each light emitting device 200. The filler 310 may be dispensed along lower outer surfaces of the light emitting device 200.

Then, the double phosphor film 300 may be divided by a dicing process to form a plurality of the individual stacked structures 320. The stacked structure 320 may include the double phosphor film 300 having the barrier layer 302 and the phosphor layer 304 and the light emitting device 200 adhered on the double phosphor film 300. The upper surface of the light emitting device 200 opposite to the lower surface on which the first and second electrodes 210*a*, 210*b* are provided may be adhered on the double phosphor film 300.

Figure 25:
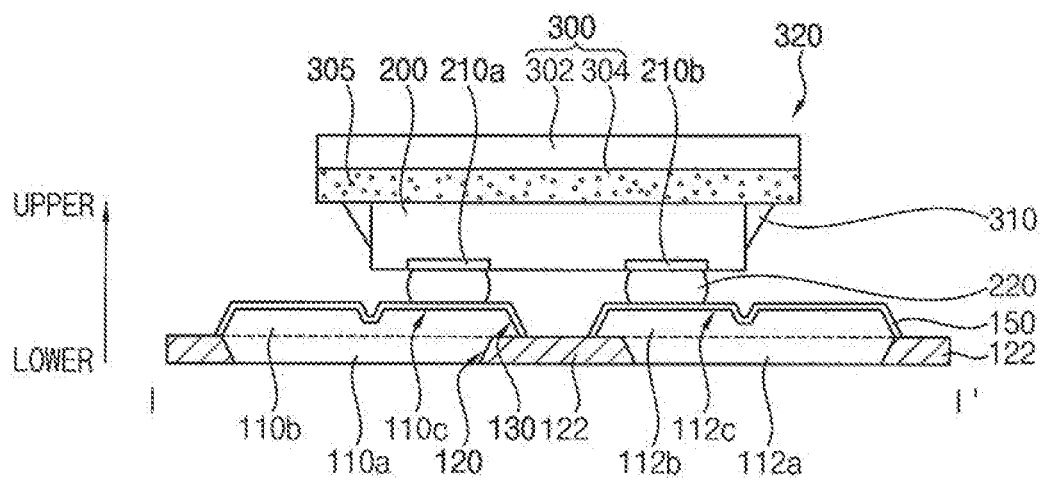
Figure 26:
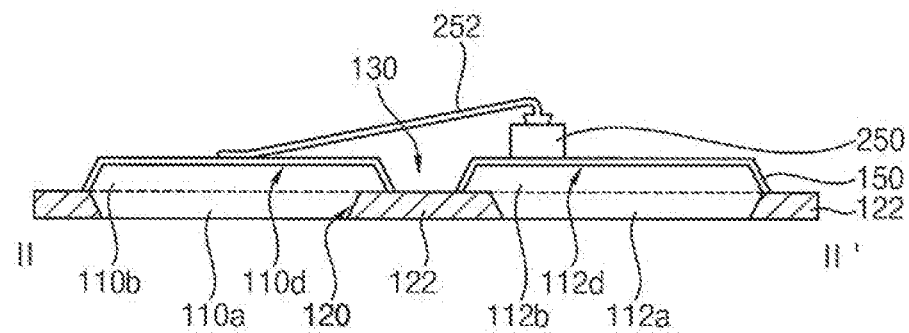
Figure 27:
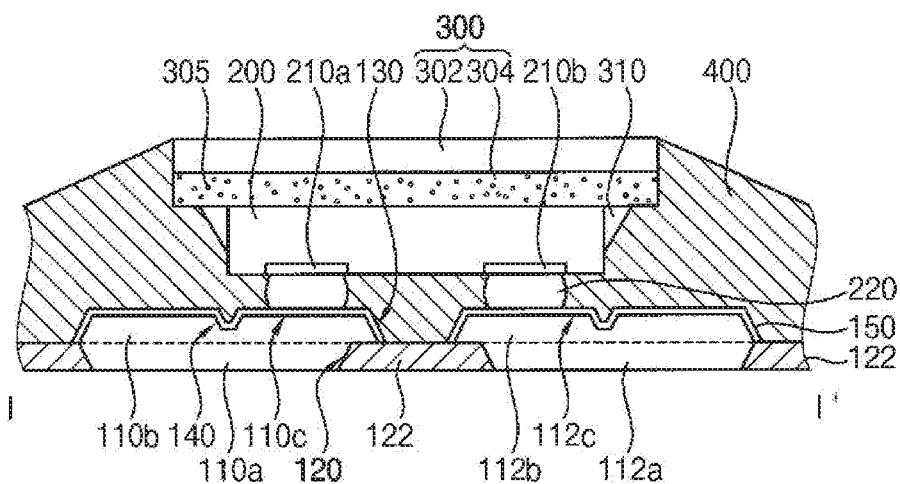

Referring to FIGS. 25, 26 and 27, the stacked structure 320 and a diode 250 may be mounted on the mounting substrate.

In example embodiments, the stacked structure 320 may be mounted on the mounting substrate such that the light emitting device 200 is mounted on the mounting substrate in a flip chip bonding manner. The light emitting device 200 may be arranged on the mounting substrate such that the lower surface of the light emitting device 200 on which the first and second electrodes 210*a*, 210*b* is provided faces the mounting substrate. The light emitting device 200 may be mounted on the mounting substrate via connection members 220 such as solder bumps. The first electrode 210*a* may be bonded to the first bonding region 110*c* of the first upper electrode portion 110*b* by the connection member 220, and the second electrode 210*b* may be bonded to the second bonding region 112*c* of the second upper electrode portion 112*b* by the connection member 220.

A longitudinal direction of the light emitting device 200 may be parallel with the first direction. A plurality of the first electrodes 210*a* may be arranged in the first direction on the lower surface of the light emitting device 200 corresponding to a plurality of the first bonding regions 110*c* of the first upper electrode portion 110*b*. A plurality of the second electrodes 210*b* may be arranged in the first direction on the lower surface of the light emitting device 200 corresponding to a plurality of the second bonding regions 112*c* of the second upper electrode portion 112*b*.

In example embodiments, the insulation support member 122 may be arranged between the first and second lower electrode portions 110*a* and 112*a*, and the second groove 130 may be formed between the first and second upper electrode portions 110*b* and 112*b* to expose the insulation support member 122. The upper surfaces of the first and second upper electrode portions 110*b* and 112*b* may be formed higher than the upper surface of the insulation support member 122, that is, a bottom surface of the second groove 130.

Accordingly, the insulation support member 122 may be formed lower than the upper surfaces of the first and second electrode portions to thereby prevent spreading of the solder bump during the flip chip bonding process. Additionally, the first recesses 140 may be formed around the first and second bonding regions 110*c* and 112*c* to thereby prevent spreading of the solder bump during the flip chip bonding process.

The diode 250 may be arranged adjacent to the light emitting device 200 on the mounting substrate. For example, the diode 250 may include a zener diode. A reverse current generated when a reverse voltage is applied may be blocked from flowing to the light emitting device 200, to thereby prevent damage to the light emitting device.

The diode 250 may be mounted on the second upper electrode portion 112*b*. The diode 250 may include an upper electrode electrically connected to the first upper electrode portion 110*b* and a lower electrode electrically connected to the second upper electrode portion 112*b*. For example, the upper electrode may be bonded to the third bonding region 110*d* of the first upper electrode portion 110*b* by a bonding wire 252 and the lower electrode may be bonded to the fourth bonding region 112d of the second upper electrode portion 112b by a conductive connection member. The conductive connection member may include a conductive film.

In example embodiments, the diode may be mounted on the mounting substrate by a wire bonding method. However, example embodiments are not limited thereto. For example, the diode may be mounted on the mounting substrate by a flip chip bonding method.

Referring to FIG. 27, a sealing member 400 may be formed on the mounting substrate to cover the light emitting device 200 and the double phosphor film 300.

In example embodiments, the sealing member 400 may be dispensed onto the mounting substrate to cover the light emitting device 200 and the double phosphor film 300. The sealing member 400 may be formed to expose an upper surface of the double phosphor film 300. The sealing member 400 may be formed to cover the first surface (i.e., an upper surface) of the mounting substrate, side surfaces of the double phosphor film 300 and side surfaces of the light emitting device 200. For example, the sealing member 400 may include titanium dioxide ($TiO_2$). The sealing member 400 may include a transparent material. Additionally, the sealing member 400 may further include a fluorescent material.

The dispensed sealing member 400 may have a dent along a peripheral region thereof by the second edge grooves 131 formed along the peripheral region of the mounting substrate. (See, e.g., FIG. 17).

Thus, the barrier layer 302 may be formed on the phosphor layer 304 on the light emitting surface of the light emitting device 200 to cover the underlying phosphor layer 304 to prevent the phosphor of the phosphor layer 304 from degrading due to moisture.

Referring to FIGS. 28 to 31, the mounting substrate may be diced to form a singulated light emitting device package.

An upper side edge 410 of the sealing member 400 of the light emitting device package may have an obtuse angle (θ) with respect to a side surface thereof. For example, the obtuse angle (θ) of the upper side edge 410 of the sealing member 400 may range from about 95 degrees to about 150 degrees.

Figure 32:
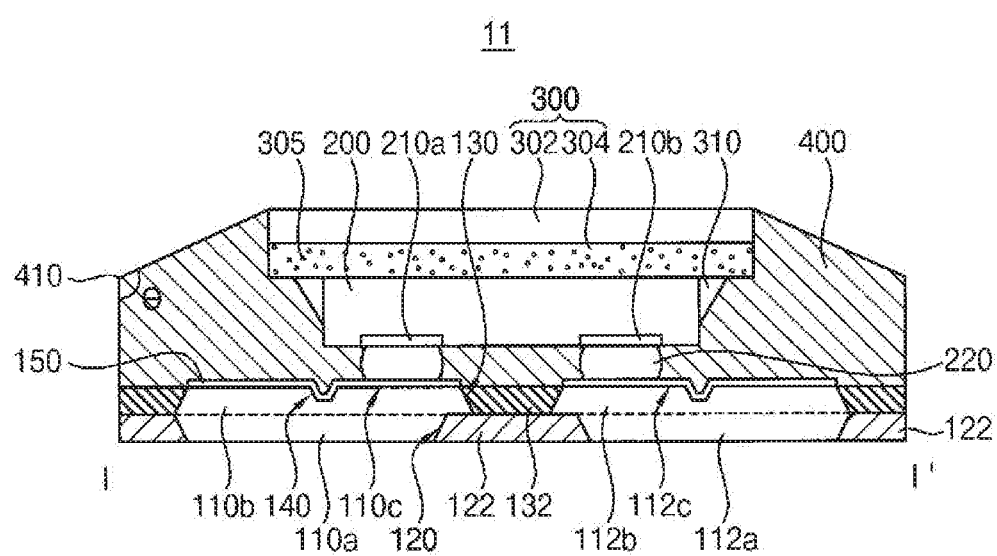
FIG. 32 is a cross-sectional view illustrating a light emitting device package in accordance with example embodiments.

FIG. 32 is a cross-sectional view illustrating a light emitting device package in accordance with example embodiments. The light emitting device package may be substantially the same as or similar to the light emitting device package as described with reference to FIG. 1, except for a second insulation support member. Thus, same reference numerals will be used to refer to the same or like elements and any further repetitive explanation concerning the above elements will be omitted.

Referring to FIG. 32, a mounting substrate of a light emitting device package 11 may include first and second electrode portions separated by a recess, an insulation support member 122 filling a lower portion of the recess and covering a side surface of each of the first and second electrode portions, and a second insulation support member 132 filling an upper portion of the recess.

The first electrode portion may include a first lower electrode portion 110a and a first upper electrode portion 110b on the first lower electrode portion 110a, and the second electrode portion may include a second lower electrode portion 112a and a second upper electrode portion 112b on the second lower electrode portion 112a.

The first groove 120 may be formed between the first lower electrode portion 110a and the second lower electrode portion 112a, the second groove 130 may be formed between the first upper electrode portion 110b and the second upper electrode portions 112b, and the first groove 120 and the second groove 130 may be connected to each other to form the recess. A width of the first groove 120 may be the same as or less than a width of the second groove 130.

The insulation support member 122 may fill up the first groove 120, cover side surfaces of each of the first and second lower electrode portions 110a and 112a, and expose the first and second upper electrode portions 110b and 112b. The second insulation support member 132 may fill up the second groove 130 and cover side surfaces of each of the first and second upper electrode portions 110b and 112b.

The insulation support member 122 and the second insulation support member 132 may have a height sufficient to prevent spreading of a solder bump.

The second insulation support member 132 may fill up the second groove 130 between the first and second upper electrode portions 110b and 112b sufficiently to prevent spreading of the solder bump during a flip chip bonding process.

Hereinafter, a method of manufacturing the light emitting device package in FIG. 32 will be explained.

Figure 33:
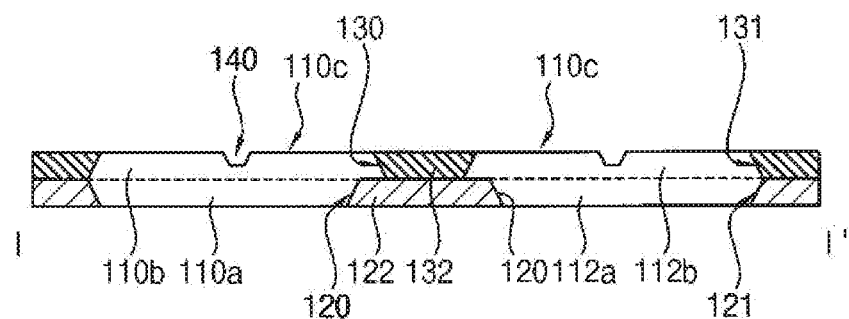
FIGS. 33 and 34 are cross-sectional views illustrating stages of manufacturing a light emitting device package in accordance with example embodiments.
Figure 34:
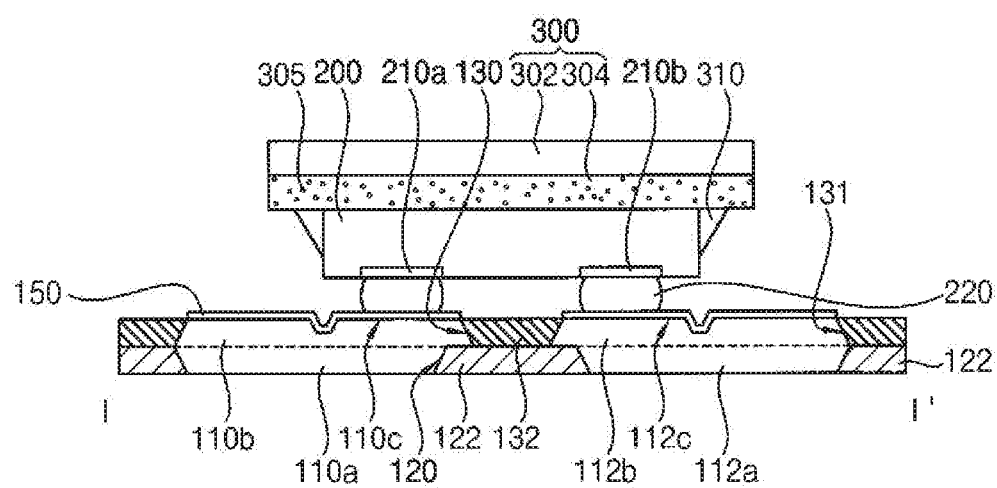

FIGS. 33 and 34 are cross-sectional views illustrating stages of manufacturing a light emitting device package in accordance with example embodiments.

Referring to FIGS. 33 and 34, first, the steps as illustrated with reference to FIGS. 5 to 18 maybe performed such that a first surface 102 of a metal substrate 100 is etched to form first and second upper electrode portions 110b and 112b separated by a second groove 130.

Then, after an insulation material is coated on the first surface 102 of the metal substrate 100, an upper portion of the coated insulation material may be removed until surfaces of the first and second upper electrode portions 110b and 112b are exposed, to form a second insulation support member 132, as shown in FIG. 33.

The second insulation support member 132 may be formed to surround both side surfaces of the first upper electrode portion 110b. The second insulation support member 132 may be formed to surround both side surfaces of the second upper electrode portion 112b. The second insulation support member 132 may fill the second groove 130 and second edge grooves 131.

The second insulation support member 132 may include an insulating material such as epoxy molding compound (EMC), silicon molding compound (SMC), silicon resin (SR), etc. A surface of the second insulation support member 132 may be coplanar with the exposed surfaces of the first and second upper electrode portions 110b and 112b. Alternatively, the surface of the second insulation support member 132 may be lower or higher than the exposed surfaces of the first and second upper electrode portions 110b and 112b.

Then, after a stacked structure 320 and a diode 250 are mounted on the first and second upper electrode portions 110b and 112b, and a sealing member 400 may be formed to cover the light emitting device 200 and a double phosphor film 300.

FIGS. 35 to 38 are plan views illustrating a mounting substrate of a light emitting device package in accordance with example embodiments.

Figure 35:
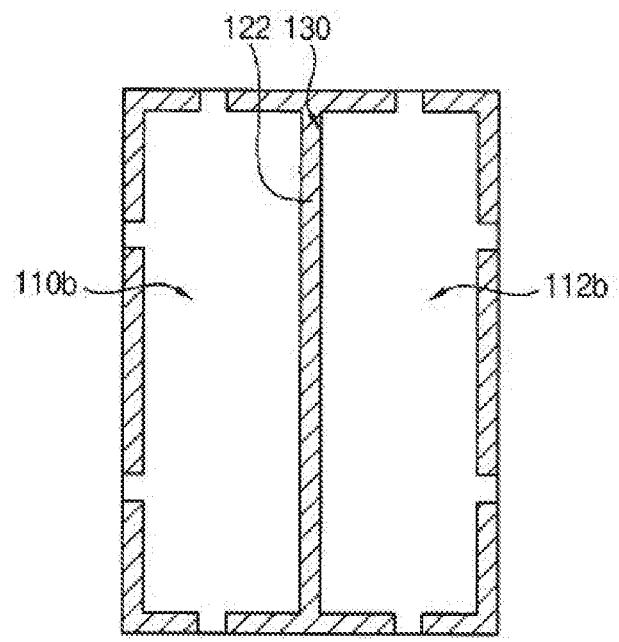
FIGS. 35 to 38 are plan views illustrating a mounting substrate of a light emitting device package in accordance with example embodiments.

Referring to FIG. 35, a second groove 130 may be formed between a first upper electrode portion 110b and a second upper electrode portion 112b. A first groove (not illustrated) may be formed between a first lower electrode portion under the first upper electrode portion 110b and a second lower electrode portion under the second upper electrode portion 112b. An insulation support member 122 may fill the first groove and cover side surfaces of the first and second lower electrode portions.

The second groove 130 may be connected to the first groove to form a recess across a mounting substrate. The second groove 130 may extend in a straight line along a first direction. Accordingly, the recess may have a shape extending in the first direction.

Figure 36:
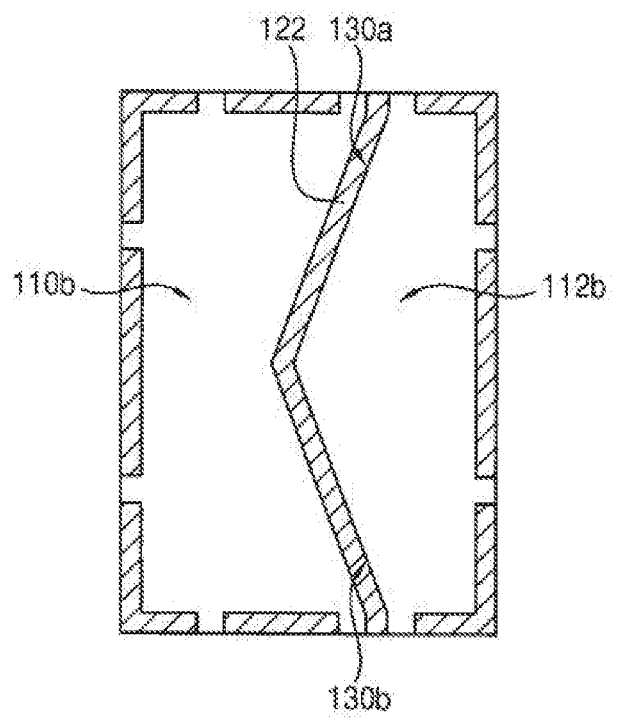

Referring to FIG. 36, a second groove 130 may include third and fourth extending groove portions 130a and 130b extending in different directions. The third extending groove portion 130a may extend in a third direction, and the fourth extending groove portion 130b may extend from an end portion of the third extending groove portion 130a in a fourth third direction different from the third direction.

Accordingly, the recess may include a first extending recess portion extending in the third direction and a second extending recess portion extending in the fourth direction.

Since the recess has a bended portion, a mounting substrate may be prevented from being damaged due to impact exerted when a light emitting device is mounted on the mounting substrate.

Figure 37:
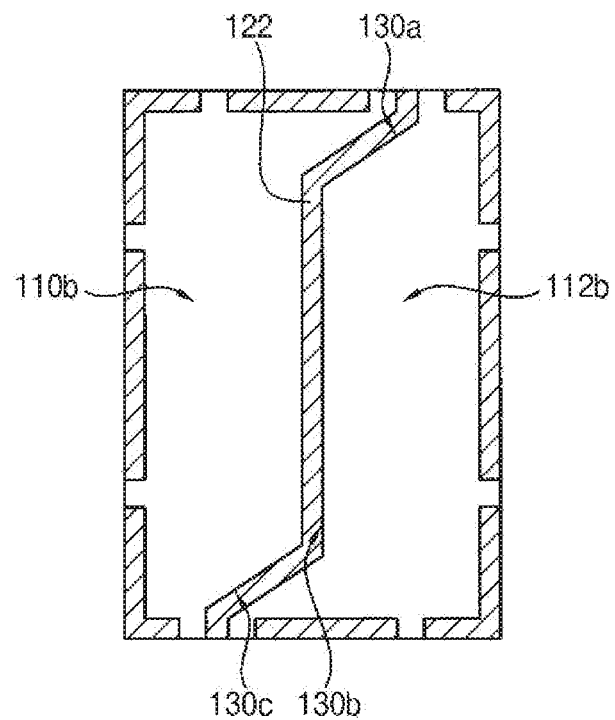
Figure 38:
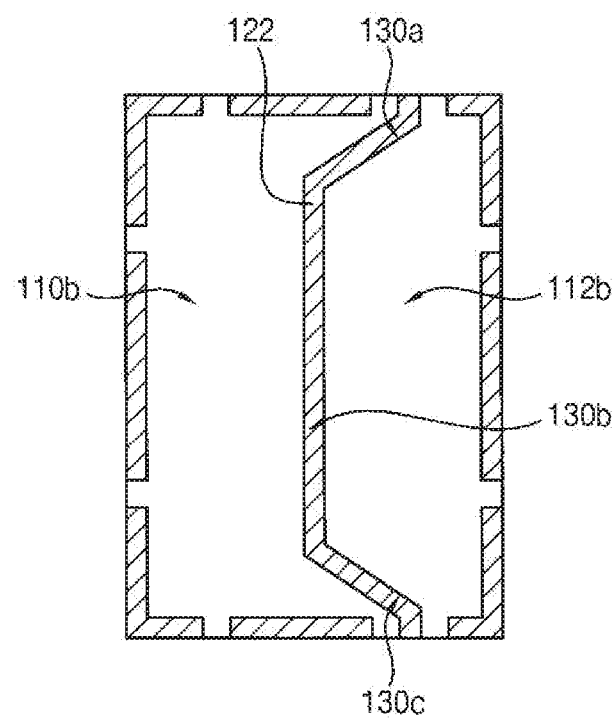

Referring to FIGS. 37 and 38, a second groove 130 may include a third extending groove portion 130a, a fourth extending groove portion 130b, and a fifth extending groove portion 130c extending in different directions. The third extending groove portion 130a may extend in a third direction, the fourth extending groove portion 130b may extend from an end portion of the third extending groove portion 130a in a fourth third direction different from the third direction, and the fifth extending groove portion 130c may extend from an end portion of the fourth extending groove portion 130b in a fifth third direction different from the fourth direction.

Accordingly, the recess may include a first extending recess portion extending in the third direction, a second extending recess portion extending in the fourth direction and a third extending recess portion extending in the fourth direction.

Since the recess has a bended portion, a mounting substrate may be prevented from being damaged due to impact exerted when a light emitting device is mounted on the mounting substrate.

A light emitting device package in accordance with example embodiments may be used in various illumination devices. For example, the light emitting device packages may be arranged in a matrix array to constitute a light emitting module of an illumination device.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of example embodiments as defined in the claims.

What is claimed is:

1. A method of manufacturing a light emitting device package, the method comprising:
    providing a metal substrate having a first surface and a second surface opposite to each other;
    etching the first surface of the metal substrate to form a first lower electrode portion and a second lower electrode portion separated by a first groove;
    forming an insulation support member filling the first groove;
    etching the second surface of the metal substrate to form a first upper electrode portion and a second upper electrode portion on the first lower electrode portion and the second lower electrode portion respectively, the first upper electrode portion and the second upper electrode portion being separated by a second groove connected to the first groove;
    stacking a light emitting device on a double phosphor film having a barrier layer and a phosphor layer to form a stacked structure;
    arranging the stacked structure on the metal substrate such that the light emitting device is mounted on the first upper electrode portion and the second upper electrode portion; and
    forming a sealing member on the insulation support member and the first upper electrode portion and the second upper electrode portion to cover the light emitting device and the double phosphor film.

2. The method of claim 1, wherein forming the stacked structure comprises:
    sequentially stacking the barrier layer and the phosphor layer on a base film to form the double phosphor film having a thickness of about 200 μm or less;
    adhering a plurality of the light emitting devices on the phosphor layer; and
    dicing the barrier layer and the phosphor layer to form a plurality of the stacked structures.

3. The method of claim 1, wherein when viewed in plan view, a combined area occupied by the first upper electrode portion and the second upper electrode portion or by the first lower electrode portion and the second lower electrode portion is 70% or more of a whole area of the light emitting device package.

4. The method of claim 1, wherein the phosphor layer includes KSF phosphor having a particle size of about 13 μm to about 22 μm.

5. The method of claim 1, wherein a first thickness of the phosphor layer is greater than a second thickness of the barrier layer.

6. The method of claim 1, wherein arranging the stacked structure on the metal substrate comprises mounting the light emitting device on the first upper electrode portion and the second upper electrode portion in a flip chip bonding manner.

7. The method of claim 1, further comprising:
    forming an electroplating layer on surfaces of the first upper electrode portion and the second upper electrode portion.

8. The method of claim 1, wherein the insulation support member covers side surfaces of the first lower electrode portion and the second lower electrode portion, and exposes the first upper electrode portion and the second upper electrode portion.

9. The method of claim 1, wherein etching the second surface of the metal substrate comprising forming recesses in upper surfaces of the first upper electrode portion and the second upper electrode portion adjacent respectively to regions where connection members for electrical connection with the light emitting device are bonded.

10. The method of claim 1, further comprising:
    forming a second insulation support member filling the second groove, after etching the second surface of the metal substrate.

11. A method of manufacturing a light emitting device package, the method comprising:
    forming a mounting substrate by forming a first lower electrode portion and a second lower electrode portion separated by a first groove and an insulation support member filling the first groove, and forming a first upper electrode portion and a second upper electrode portion separated by a second groove connected to the first groove and disposed on the first lower electrode portion and the second lower electrode portion respectively;

stacking a light emitting device on a double phosphor film having a barrier layer and a phosphor layer to form a stacked structure;

arranging the stacked structure on the mounting substrate such that the light emitting device is mounted on the first upper electrode portion and the second upper electrode portion; and forming a sealing member on the insulation support member and the first upper electrode portion and the second upper electrode portion to cover the light emitting device and the double phosphor film.

12. A method of manufacturing a light emitting device package, the method comprising:

forming a mounting substrate including a first lower electrode portion and a second lower electrode portion separated by a first groove, a first upper electrode portion and a second upper electrode portion separated by a second groove connected to the first groove and disposed on the first lower electrode portion and the second lower electrode portion respectively, and an insulation support member filling the first groove;

stacking a light emitting device on a double phosphor film having a barrier layer and a phosphor layer to form a stacked structure;

arranging the stacked structure on the mounting substrate such that the light emitting device is mounted on the first upper electrode portion and the second upper electrode portion; and forming a sealing member on the insulation support member and the first upper electrode portion and the second upper electrode portion to cover the light emitting device and the double phosphor film, wherein forming the stacked structure comprises;

sequentially stacking the barrier layer and the phosphor layer on a base film to form the double phosphor film having a thickness of about 200 μm or less;

adhering a plurality of the light emitting devices on the phosphor layer; and dicing the barrier layer and the phosphor layer to form a plurality of the stacked structures.

13. The method of claim 11, wherein when viewed in plan view, a combined area occupied by the first upper electrode portion and the second upper electrode portion or by the first lower electrode portion and the second lower electrode portion is 70% or more of a whole area of the mounting substrate.

14. The method of claim 11, wherein the phosphor layer includes KSF phosphor having a particle size of about 13 μm to about 22 μm.

15. The method of claim 11, wherein a first thickness of the phosphor layer is greater than a second thickness of the barrier layer.

* * * * *